US 6,610,566 B2

(12) United States Patent
Forbes et al.

(10) Patent No.: US 6,610,566 B2
(45) Date of Patent: *Aug. 26, 2003

(54) CIRCUIT AND METHOD FOR AN OPEN BIT LINE MEMORY CELL WITH A VERTICAL TRANSISTOR AND TRENCH PLATE TRENCH CAPACITOR

(75) Inventors: Leonard Forbes, Corvallis, OR (US); Wendell P. Noble, Milton, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/730,245

(22) Filed: Dec. 5, 2000

(65) Prior Publication Data

US 2001/0000918 A1 May 10, 2001

Related U.S. Application Data

(60) Continuation of application No. 09/143,606, filed on Aug. 31, 1998, now Pat. No. 6,156,604, which is a division of application No. 08/944,890, filed on Oct. 6, 1997.

(51) Int. Cl.[7] .......................................... H01L 21/8242
(52) U.S. Cl. ...................................... 438/241; 438/244
(58) Field of Search ................................ 438/241, 243, 438/244, 386, 387

(56) References Cited

U.S. PATENT DOCUMENTS

| 3,657,575 A | 4/1972 | Taniguchi et al. ........... 307/304 |
| 4,020,364 A | 4/1977 | Kuijk ........................... 307/242 |
| 4,051,354 A | 9/1977 | Choate ......................... 235/312 |
| 4,252,579 A | 2/1981 | Ho et al. ...................... 148/174 |
| 4,313,106 A | 1/1982 | Hsu ............................ 340/825.91 |
| 4,604,162 A | 8/1986 | Sobczak ....................... 156/657 |
| 4,617,649 A | 10/1986 | Kyomasu et al. ........... 365/189 |
| 4,663,831 A | 5/1987 | Birrittella et al. ........ 129/576 E |
| 4,673,962 A | 6/1987 | Chatterjee et al. ......... 357/23.6 |
| 4,701,423 A | 10/1987 | Szluk ............................ 437/57 |

(List continued on next page.)

FOREIGN PATENT DOCUMENTS

| JP | 63-066963 | 3/1988 | ........... H01L/27/10 |
| JP | 11-135757 | 5/1999 | ......... H01L/27/108 |

OTHER PUBLICATIONS

Adler, E., et al., "The Evolution of IBM CMOS DRAM Technology", *IBM J. Res. Develop.*, 39(1/2), 167–188, (1995).

Asai, S., et al., "Technology Challenges for Integration Near and Below 0.1 micrometer", *Proceedings of the IEEE, 85(4)*, Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers,* San Diego, CA, 79–80, (May 1986).

(List continued on next page.)

Primary Examiner—Chandra Chaudhari
(74) Attorney, Agent, or Firm—Schwegman, Lundberg, Woessner & Kluth, P.A.

(57) ABSTRACT

A circuit and method for a memory cell with a vertical transistor and a trench capacitor. The cell includes an access transistor that is formed in a pillar of a single crystal semiconductor material. The transistor has vertically aligned first and second source/drain regions and a body region. The transistor also includes a gate that is formed along a side of the pillar. A trench capacitor is also included in the cell. A first plate of the trench capacitor is formed integral with the first source/drain region. A second plate is disposed adjacent to the first plate and separated from the first plate by a gate oxide.

24 Claims, 13 Drawing Sheets

U.S. PATENT DOCUMENTS

| | | | |
|---|---|---|---|
| 4,716,314 A | 12/1987 | Mulder et al. | 307/477 |
| 4,761,768 A | 8/1988 | Turner et al. | 365/201 |
| 4,766,569 A | 8/1988 | Turner et al. | 365/185 |
| 4,845,537 A | 7/1989 | Nishimura et al. | 357/23.4 |
| 4,888,735 A | 12/1989 | Lee et al. | 365/185 |
| 4,920,065 A | 4/1990 | Chin et al. | 437/52 |
| 4,920,389 A | 4/1990 | Itoh | 357/23.6 |
| 4,920,515 A | 4/1990 | Obata | 365/189.08 |
| 4,949,138 A | 8/1990 | Nishimura | 357/23.6 |
| 4,958,318 A | 9/1990 | Harari | 365/149 |
| 4,965,651 A | 10/1990 | Wagner | 357/42 |
| 4,987,089 A | 1/1991 | Roberts | 437/34 |
| 5,001,526 A | 3/1991 | Gotou | 357/23.6 |
| 5,006,909 A | 4/1991 | Kosa | 357/23.6 |
| 5,010,386 A | 4/1991 | Groover, III | 357/42 |
| 5,017,504 A | 5/1991 | Nishimura et al. | 437/40 |
| 5,021,355 A | 6/1991 | Dhong et al. | 437/35 |
| 5,028,977 A | 7/1991 | Kenneth et al. | 357/43 |
| 5,057,896 A | 10/1991 | Gotou | 357/49 |
| 5,072,269 A | 12/1991 | Hieda | 357/23.6 |
| 5,083,047 A | 1/1992 | Horie et al. | 307/465 |
| 5,087,581 A | 2/1992 | Rodder | 437/41 |
| 5,102,817 A | 4/1992 | Chatterjee et al. | 437/47 |
| 5,107,459 A | 4/1992 | Chu et al. | 365/63 |
| 5,110,752 A | 5/1992 | Lu | 437/47 |
| 5,156,987 A | 10/1992 | Sandhu et al. | 437/40 |
| 5,177,028 A | 1/1993 | Manning | 437/41 |
| 5,177,576 A | 1/1993 | Kimura et al. | 257/71 |
| 5,181,089 A | 1/1993 | Matsuo et al. | 257/299 |
| 5,202,278 A | 4/1993 | Mathews et al. | 437/47 |
| 5,208,657 A | 5/1993 | Chatterjee et al. | 257/302 |
| 5,216,266 A | 6/1993 | Ozaki | 257/302 |
| 5,221,867 A | 6/1993 | Mitra et al. | 307/465 |
| 5,223,081 A | 6/1993 | Doan | 156/628 |
| 5,266,514 A | 11/1993 | Tuan et al. | 437/52 |
| 5,308,782 A | 5/1994 | Mazure et al. | 437/52 |
| 5,316,962 A | 5/1994 | Matsuo et al. | 437/52 |
| 5,320,880 A | 6/1994 | Sandhu et al. | 427/578 |
| 5,327,380 A | 7/1994 | Kersh, III et al. | 365/195 |
| 5,376,575 A | 12/1994 | Kim et al. | 437/52 |
| 5,379,255 A | 1/1995 | Shah | 365/185 |
| 5,382,540 A | 1/1995 | Sharma et al. | 437/52 |
| 5,391,911 A | 2/1995 | Beyer et al. | 257/522 |
| 5,392,245 A | 2/1995 | Manning | 365/200 |
| 5,393,704 A | 2/1995 | Huang et al. | 437/203 |
| 5,396,093 A | 3/1995 | Lu | 257/306 |
| 5,410,169 A | 4/1995 | Yamamoto et al. | 257/301 |
| 5,414,287 A | 5/1995 | Hong | 257/316 |
| 5,416,350 A | 5/1995 | Watanabe | 257/330 |
| 5,416,736 A | 5/1995 | Kosa et al. | 365/174 |
| 5,422,296 A | 6/1995 | Lage | 437/52 |
| 5,422,499 A | 6/1995 | Manning | 257/67 |
| 5,427,972 A | 6/1995 | Shimizu et al. | 437/52 |
| 5,432,739 A | 7/1995 | Pein | 365/185 |
| 5,438,009 A | 8/1995 | Yang et al. | 437/52 |
| 5,440,158 A | 8/1995 | Sung-Mu | 257/314 |
| 5,445,986 A | 8/1995 | Hirota | 437/60 |
| 5,451,889 A | 9/1995 | Heim et al. | 326/81 |
| 5,460,316 A | 10/1995 | Hefele | 228/39 |
| 5,460,988 A | 10/1995 | Hong | 437/43 |
| 5,466,625 A | 11/1995 | Hsieh et al. | 437/52 |
| 5,483,094 A | 1/1996 | Sharma et al. | 257/316 |
| 5,483,487 A | 1/1996 | Sung-Mu | 365/185.33 |
| 5,492,853 A | 2/1996 | Jeng et al. | 437/60 |
| 5,495,441 A | 2/1996 | Hong | 365/185.01 |
| 5,497,017 A | 3/1996 | Gonzales | 257/306 |
| 5,502,629 A | 3/1996 | Ito et al. | 363/60 |
| 5,504,357 A | 4/1996 | Kim et al. | 257/306 |
| 5,508,219 A | 4/1996 | Bronner et al. | 437/52 |
| 5,508,542 A | 4/1996 | Geiss et al. | 257/301 |
| 5,519,236 A | 5/1996 | Ozaki | 257/302 |
| 5,528,062 A | 6/1996 | Hsieh et al. | 257/298 |
| 5,563,083 A | 10/1996 | Pein | 437/43 |
| 5,574,299 A | 11/1996 | Kim | 257/296 |
| 5,576,238 A | 11/1996 | Fu | 437/52 |
| 5,581,101 A | 12/1996 | Ning et al. | 257/347 |
| 5,593,912 A | 1/1997 | Rajeevkumar | 437/52 |
| 5,612,559 A | 3/1997 | Park et al. | 257/302 |
| 5,616,934 A | 4/1997 | Dennison et al. | 257/67 |
| 5,627,097 A | 5/1997 | Venkatesan et al. | 438/217 |
| 5,637,898 A | 6/1997 | Baliga | 257/330 |
| 5,640,342 A | 6/1997 | Gonzalez | 365/156 |
| 5,644,540 A | 7/1997 | Manning | 365/200 |
| 5,646,900 A | 7/1997 | Tsukude et al. | 365/205 |
| 5,674,769 A | 10/1997 | Alsmeier et al. | 437/52 |
| 5,691,230 A | 11/1997 | Forbes | 437/62 |
| 5,705,415 A | 1/1998 | Orlowski et al. | 437/43 |
| 5,753,947 A | 5/1998 | Gonzalez | 257/296 |
| 5,789,967 A | 8/1998 | Katoh | 327/408 |
| 5,818,084 A | 10/1998 | Williams et al. | 257/329 |
| 5,821,578 A | 10/1998 | Shimoji | 257/295 |
| 5,821,796 A | 10/1998 | Yaklin et al. | 327/313 |
| 5,827,765 A | 10/1998 | Stengl et al. | 438/243 |
| 5,852,375 A | 12/1998 | Byrne et al. | 327/108 |
| 5,864,158 A | 1/1999 | Liu et al. | 257/330 |
| 5,909,400 A | 6/1999 | Bertin et al. | 365/187 |
| 5,909,618 A | 6/1999 | Forbes et al. | 438/242 |
| 5,914,511 A | 6/1999 | Noble et al. | 257/302 |
| 5,917,342 A | 6/1999 | Okamura | 326/103 |
| 5,920,088 A | 7/1999 | Augusto | 257/192 |
| 5,926,412 A | 7/1999 | Evans, Jr. et al. | 365/145 |
| 5,936,274 A | 8/1999 | Forbes et al. | 257/315 |
| 5,946,472 A | 8/1999 | Graves et al. | 395/500 |
| 5,963,469 A | 10/1999 | Forbes | 365/149 |
| 5,973,352 A | 10/1999 | Noble | 257/315 |
| 5,973,356 A | 10/1999 | Noble et al. | 257/319 |
| 5,981,995 A | 11/1999 | Selcuk | 257/330 |
| 6,006,166 A | 12/1999 | Meyer | 702/119 |
| 6,040,210 A | 3/2000 | Burns, Jr. et al. | 438/238 |
| 6,040,218 A | 3/2000 | Lam | 438/259 |
| 6,072,209 A | 6/2000 | Noble et al. | 257/296 |
| 6,150,687 A | 11/2000 | Noble et al. | 257/302 |
| 6,156,604 A * | 12/2000 | Forbes et al. | 438/241 |
| 6,172,391 B1 | 1/2001 | Goebel | 257/305 |
| 6,238,976 B1 | 5/2001 | Noble et al. | 438/259 |

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits, 27(4)*, pp. 618–624, (Apr. 1992).

Bomchil, G., et al., "Porous Silicon: The Material and its Applications in Silicon–On–Insulator Technologies", *Applied Surface Science, 41/42*, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

Burnett, D., et al., "Statistical Threshold–Voltage Variation and its Impact on Supply–Voltage Scaling", *Proceedings SPIE: Microelectronic Device and Multilevel Interconnection Technology, 2636*, 83–90, (1995).

Chen, M., et al., "Back–Gate Forward Bias Method for Low Voltage CMOS Digital Cicuits", *IEEE Transactions on Electron Devices, 43*, 904–909, (1996).

Chen, M.J., et al., "Back–Gate Forward Bias Method for Low–Voltage CMOS Digital Cicuits", *IEEE Transactions on Electron Devices, 43*, 904–909, (Jun. 1996).

Chen, M.J., et al., "Optimizing the Match in Weakly Inverted MOSFET's by Gated Lateral Bipolar Action", *IEEE Transactions on Electron Devices, 43,* 766–773, (May 1996).

Chung, I.Y., et al., "A New SOI Inverter for Low Power Applications", *Proceedings of the 1996 IEEE International SOI Conference,* Sanibel Island, FL, 20–21, (1996).

De, V.K., et al., "Random MOSFET Parameter Fluctuation Limits to Gigascale Integration (GSI)", *1996 Symposium on VLSI Technology, Digest of Technical Papers,* Honolulu, HI, 198–199, (Jun. 11–13, 1996).

De, V.K., et al., "Random Mosfet Parameter Fluctuation Limits to Gigascale Integration (GST)", *Symposium on VLSI Technology Digest of Technical Papers,* 198–199, (1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters, 17(11),* 509–511, (Nov. 1996).

Fong, Y., et al., "Oxides Grown on Textured Single–Crystal Silicon—Dependence on Process and Application in EEPROM's", *IEEE Transactions on Electron Devices, 37(3),* pp. 583–590, (Mar. 1990).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers,* 286–287, (1997).

Gong, S., et al., "Techniques for Reducing Switching Noise in High Speed Digital Systems", *Proceedings of the 8th Annual IEEE International ASIC Conference and Exhibit,* Austin, TX, 21–24, (1995).

Hao, M.Y., et al., "Electrical Characteristics of Oxynitrides Grown on Textured Single–Crystal Silicon", *Appl. Phys. Lett., 60,* 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers,* Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest,* Washington, D.C., 959–961, (Dec. 8–11, 1991).

Hodges, D.A., et al., "MOS Decoders", *In: Analysis and Design of Digital Integrated Circuits, 2nd Edition,* Section: 9.1.3, 354–357, (1988).

Holman, W.T., et al., "A Compact Low Noise Operational Amplifier for a 1.2 Micrometer Digital CMOS Technology", *IEEE Journal of Solid–State Circuits, 30,* 710–714, (Jun. 1995).

Hu, G., et al., "Will Flash Memory Replace Hard Disk Drive?", *1994 IEEE International Electron Device Meeting,* Panel Discussion, Session 24, Outline, 2 pages, (Dec. 1994).

Huang, W.L., et al., "TFSOI Complementary BiCMOS Technology for Low Power Applications", *IEEE Transactions on Electron Devices, 42,* 506–512, (Mar. 1995).

Jun, Y.K., et al., "The Fabrication and Electrical Properties of Modulated Stacked Capacitor for Advanced DRAM Applications", *IEEE Electron Device Letters, 13,* 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits, 31,* 1575–1583, (Nov. 1996).

Kang, H.K., et al., "Highly Manufacturable Process Technology for Reliable 256 Mbit and 1Gbit DRAMs", *IEEE International Electron Devices Meeting, Technical Digest,* San Francisco, CA, 635–638, (Dec. 11–14, 1994).

Kim, Y.S., et al., "A Study on Pyrolysis DMEAA for Selective Deposition of Aluminum", *In: Advanced Metallization and Interconnect Systems for ULSI Applications in 1995,* R.C. Ellwanger, et al., (eds.), Materials Research Society, Pittsuburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics, 34,* 6899–6902, (Dec. 1995).

Kohyama, Y., et al., "Buried Bit–Line Cell for 64MB DRAMs", *1990 Symposium on VLSI Technology, Digest of Technical Papers,* Honolulu, HI, 17–18, (Jun. 4–7, 1990).

Koshida, N., et al., "Efficient Visible Photoluminescence from Porous Silicon", *Japanese Journal of Applied Physics, 30,* L1221–L1233, (Jul. 1991).

Kuge, S., et al., "SOI–DRAM Circuit Technologies for Low Power High Speed Multigiga Scale Memories", *IEEE Journal of Solid–State Circuits, 31(4),* pp. 586–591, (Apr. 1996).

Lantz, II, L., "Soft Errors Induced By Alpha Particles", *IEEE Transactions on Reliability, 45,* 174–179, (Jun. 1996).

Lehmann, et al., "A Novel Capacitor Technology Based on Porous Silicon", *Thin Solid Films 276, Elsevier Science,* 138–42, (1996).

Lehmann, V., "The Physics of Macropore Formation in Low Doped n–Type Silicon", *Journal of the Electrochemical Society, 140(10),* 2836–2843, (Oct. 1993).

Lu, N., et al., "The SPT Cell—A New Substrate–Plate Trench Cell for DRAMs", *1985 IEEE International Electron Devices Meeting, Technical Digest,* Washington, D.C., 771–772, (Dec. 1–4, 1985).

MacSweeney, D., et al., "Modelling of Lateral Bipolar Devices in a CMOS Process", *IEEE Bipolar Circuits and Technology Meeting,* Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers,* Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices, 42,* 2117–2123, (Dec. 1995).

Malaviya, S., *IBM TBD, 15,* p. 42, (Jul. 1972).

Nitayama, A., et al., "High Speed and Compact CMOS Circuits with Multipillar Surrounding Gate Transistors", *IEEE Transactions on Electron Devices, 36,* 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes, 6,* 302–305, (Sep. 1995).

Oowaki, Y., et al., "New alpha–Particle Induced Soft Error Mechanism in a Three Dimensional Capacitor Cell", *IEICE Transactions on Electronics, 78–C,* 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics, 76–C,* 1604–1610, (Nov. 1993).

Ozaki, T., et al., "A Surrounding Isolation–Merged Plate Electrode (Simple) Cell with Checkered Layout for 256Mbit DRAMs and Beyond", *1991 IEEE International Electron Devices Meeting,* Washington, D.C., 469–472, (Dec. 8–11, 1991).

Parke, S.A., et al., "A High–Performance Lateral Bipolar Transistor Fabricated on SIMOX", *IEEE Electron Device Letters, 14,* 33–35, (Jan. 1993).

Pein, H., et al., "A 3–D Sidewall Flash EPROM Cell and Memory Array", *IEEE Transactions on Electron Devices, 40,* 2216–2127, (Nov. 1993).

Pein, H., et al., "Performance of the 3–D Pencil Flash EPROM Cell and Memory Array", *IEEE Transactions on Electron Devices, 42,* 1982–1991, (Nov. 1995).

Pein, H.B., et al., "Performance of the 3–D Sidewall Flash EPROM Cell", *IEEE International Electron Devices Meeting, Technical Digest,* 11–14, (1993).

Rao, K.V., et al., "Trench Capacitor Design Issues in VLSI DRAM Cells", *1986 IEEE International Electron Devices Meeting, Technical Digest,* Los Angeles, CA, 140–143, (Dec. 7–10, 1986).

Richardson, W.F., et al., "A Trench Transistor Cross–Point DRAM Cell", *IEEE International Electron Devices Meeting,* Washington, D.C., 714–717, (Dec. 1–4, 1985).

Sagara, K., et al., "A 0.72 micro–meter2 Recessed STC (RSTC) Technology for 256Mbit DRAMs using Quarter–Micron Phase–Shift Lithography", *1992 Symposium on VLSI Technology, Digest of Technical Papers,* Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers,* Honolulu, HI, 106–107, (Jun. 13–15, 1996).

Shah, A.H. et al., "A 4–Mbit DRAM with Trench–Transistor Cell", *IEEE Journal of Solid–State Circuits, SC–21,* 618–625, (Oct. 1986).

Shah, A.H., et al., "A 4Mb DRAM with Cross–Point Trence Transistor Cell", *1986 IEEE International Solid–State Circuits Conference, Digest of Technical Papers,* 268–269, (Feb. 21, 1986).

Sherony, M.J., et al., "Reduction of Threshold Voltage Sensitivity in SOI MOSFET's", *IEEE Electron Device Letters, 16,* 100–102, (Mar. 1995).

Shimomura, K., et al., "A 1V 46ns 16Mb SOI–DRAM with Body Control Technique", *1997 IEEE International Solid–State Circuits Conference, Digest of Technical Papers,* 68–69, (Feb. 6, 1997).

Stellwag, T.B., et al., "A Vertically–Integrated GaAs Bipolar DRAM Cell", *IEEE Transactions on Electron Devices, 38,* 2704–2705, (Dec. 1991).

Suma, K., et al., "An SOI–DRAM with Wide Operating Voltage Range by CMOS–SIMOX Technology", *IEEE Journal of Solid–State Circuits, 29(11),* pp. 1323–1329, (Nov. 1994).

Sun, J., "CMOS Technology for 1.8V and Beyond", *Int'l Sump. on VLSI Technology, Systems and Applications: Digest of Technical Papers,* 293–297, (1997).

Sunouchi, K., et al., "A Surrounding Gate Transistor (SGT) Cell for 64/256Mbit DRAMs", *1989 IEEE International Electron Devices Meeting, Technical Digest,* Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting,* San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research, B–99,* 562–565, (Nov. 7–10, 1994).

Takao, Y., et al., "A 4–um(2) Full–CMOS SRAM Cell Technology for 0.2–um High Performance Logic LSIs", *1997 Symp. on VLSI Technology: Digest of Technical Papers,* Kyoto, Japan, 11–12, (1997).

Takato, H., et al., "High Performance CMOS Surrounding Gate Transistor (SGT) for Ultra High Density LSIs", *IEEE International Electron Devices Meeting, Technical Digest,* 222–225, (1988).

Takato, H., et al., "Impact of Surrounding Gate Transistor (SGT) for Ultra–High Density LSI's", *IEEE Transactions on Electron Devices, 38,* 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers,* Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers,* Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers,* Kyoto, Japan, 21–22, (1993).

Tsui, P.G., et al., "A Versatile Half–Micron Complmentary BiCMOS Technology for Microprocessor–Based Smart Power Applications", *IEEE Transactions on Electron Devices, 42,* 564–570, (Mar. 1995).

Verdonckt–Vandebroek, S., et al., "High–Gain Lateral Bipolar Action in a MOSFET Structure", *IEEE Transactions on Electron Devices 38,* 2487–2496, (Nov. 1991).

Wang, N., *Digital MOS Integrated Circuits,* Prentice Hall, Inc., Englewood Cliffs, NJ, pp. 328–333, (1989).

Wang, P.W., et al., "Excellent Emission Characteristics of Tunneling Oxides Formed Using Ultrathin Silicon Films for Flash Memory Devices", *Japanese Journal of Applied Physics, 35,* 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest,* San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers,* Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials,* Yokohama, Japan, 478–480, (1991).

Watanabe, H., et al., "Device Application and Structure Observation for Hemispherical–Grained Si", *J. Appl. Phys., 71,* 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials,* Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits, 30,* 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices, 38,* 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest,* Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers,* Honolulu, HI, 240–241, (Jun. 11–13, 1996).

* cited by examiner

CIRCUIT AND METHOD FOR AN OPEN BIT LINE MEMORY CELL WITH A VERTICAL TRANSISTOR AND TRENCH PLATE TRENCH CAPACITOR

This application is a Continuation of U.S. application Ser. No. 09/143,606, now U.S. Pat. No. 6,156,604 filed Aug. 31, 1998, which is a Divisional of U.S. application Ser. No. 08/944,890, filed Oct. 6, 1997.

TECHNICAL FIELD OF THE INVENTION

The present invention relates generally to the field of memory devices and, in particular, to a circuit and method for an open bit line memory cell with a vertical transistor and trench plate trench capacitor.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

A memory array is typically implemented as an integrated circuit on a semiconductor substrate in one of a number of conventional layouts. One such layout is referred to as an "open digit line" architecture. In this architecture, the array is divided into at least two separate parts or "sub-arrays." Each sub-array includes a number of rows and columns of memory cells. Each memory cell in a row is coupled to a common word line and each transistor in a column is coupled to a common bit line. Each bit line in the first sub-array is paired with a bit line in the second sub-array so as to feed into a common sense amplifier. The sense amplifier detects and amplifies differences in voltage on a pair of bit lines as described in more detail below.

To read data out of a cell, the capacitor of a cell is accessed by selecting the word line associated with the cell. A complementary bit line that is paired with the bit line for the selected cell is equilibrated with the voltage on the bit line for the selected cell. The equilibration voltage is typically midway between the high and low logic levels. Thus, conventionally, the bit lines are equilibrated to one-half of the power supply voltage, $V_{cc}/2$. When the word line is activated for the selected cell, the capacitor of the selected cell discharges the stored voltage onto the bit line, thus changing the voltage on the bit line.

The sense amplifier detects and amplifies the difference in voltage on the pair of bit lines. The sense amplifier typically includes two main components: an n-sense amplifier and a p-sense amplifier. The n-sense amplifier includes a cross-coupled pair of n-channel transistors that drive the low bit line to ground. The p-sense amplifier includes a cross-coupled pair of p-channel transistors and is used to drive the high bit line to the power supply voltage.

An input/output device for the array, typically an n-channel transistor, passes the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Each of the components of a memory device are conventionally formed as part of an integrated circuit on a "chip" or wafer of semiconductor material. One of the limiting factors in increasing the capacity of a memory device is the amount of surface area of chip used to form each memory cell. In the industry terminology, the surface area required for a memory cell is characterized in terms of the minimum feature size, "F," that is obtainable by the lithography technology used to form the memory cell. Conventionally, the memory cell is laid out with a transistor that includes first and second source/drain regions separated by a body or gate region that are disposed horizontally along a surface of the chip. When isolation between adjacent transistors is considered, the surface area required for such a transistor is generally $8F^2$ or $6F^2$.

Some researchers have proposed using a vertical transistor in the memory cell in order to reduce the surface area of the chip required for the cell. Each of these proposed memory cells, although smaller in size from conventional cells, fails to provide adequate operational characteristics when compared to more conventional structures. For example, U.S. Patent No. 4,673,962 (the '962 Patent) issued to Texas Instruments on Jun. 16, 1997. The '962 Patent discloses the use of a thin poly-silicon field effect transistor (FET) in a memory cell. The poly-silicon FET is formed along a sidewall of a trench which runs vertically into a substrate. At a minimum, the poly-silicon FET includes a junction between poly-silicon channel (58) and the bit line (20) as shown in FIG. 3 of the '962 Patent. Unfortunately, this junction is prone to charge leakage and thus the poly-silicon FET may have inadequate operational qualities to control the charge on the storage capacitor. Other known disadvantages of such thin film poly-silicon devices may also hamper the operation of the proposed cell.

Other researchers have proposed use of a "surrounding gate transistor" in which a gate or word line completely surrounds a vertical transistor. See, e.g. *Impact of a Vertical Φ-shape transistor* (VΦT) *Cell for* 1 *Gbit DRAM and Beyond*, IEEE Trans. On Elec. Devices, Vol 42, No. 12, December, 1995, pp. 2117–2123. Unfortunately, these devices suffer from problems with access speed due to high gate capacitance caused by the increased surface area of the gate which slows down the rise time of the word lines. Other vertical transistor cells include a contact between the pass transistor and a poly-silicon plate in the trench. Such vertical transistor cells are difficult to implement due to the contact and should produce a low yield.

For the reasons stated above, and for other reasons stated below which will become apparent to those skilled in the art upon reading and understanding the present specification, there is a need in the art for realizable memory cell that uses less surface area than conventional memory cells.

SUMMARY OF THE INVENTION

The above mentioned problems with memory cells and other problems are addressed by the present invention and which will be understood by reading and studying the following specification. A memory cell is described which includes a vertical transistor and trench capacitor.

In particular, an illustrative embodiment of the present invention includes a memory cell. The memory cell includes an access transistor formed in the pillar of single crystal semiconductor material. The transistor has first and second source/drain regions and a body region that are vertically aligned. The transistor also includes a gate that is disposed adjacent to a side of the pillar. The memory cell also includes a trench capacitor. The trench capacitor includes a first plate that is formed integral with the first source/drain region of the access transistor. A second plate of the trench capacitor is disposed adjacent to the first plate and separated from the first plate by a gate oxide. In another embodiment, the second plate of the trench capacitor surrounds the second source/drain region. In a further embodiment, the second plate comprises poly-silicon. In another embodiment, an ohmic contact couples the second plate to a layer of semiconductor material.

In another embodiment, a memory device is provided that includes an array of memory cells. Each cell of the array includes a vertical access transistor formed of a semiconductor pillar that extends outwardly from a substrate with body and first and second source/drain regions. The gate is disposed adjacent to the side of the pillar adjacent to the body region. Each memory cell also includes a trench capacitor wherein a first plate of the trench capacitor is integral with the first source/drain region, the second plate of the trench capacitor is disposed adjacent to the first plate. The memory device also includes a number of bit lines that are each selectively coupled to a number of the memory cells at the second source/drain region of the access transistor so as to form columns of memory cells. A number of word lines are also provided with the memory device. The word lines are orthogonal to the bit lines in a trench between rows of the memory cells. The word lines are used to address gates of the access transistors of the memory cells that are adjacent to the word line. Finally, the memory device includes addressing circuitry that is coupled to the word lines and bit lines so as to selectively access the cells of the array. In another embodiment, the surface area of each memory cell is substantially equal to four square minimum feature size ($4F^2$) wherein F refers to the minimum feature size for the lithographic process used to form the memory cell. In another embodiment, the pillar has a sub-micron width so as to allow substantially full depletion of the body region. In another embodiment, the word lines are sub-lithographic.

In another embodiment, a memory array is provided. The memory array includes an array of memory cells. Each memory cell includes an access transistor having body and first and second source/drain regions vertically formed outwardly from a substrate and a single crystalline semiconductor pillar. Also, a gate is disposed adjacent to a side of the transistor. The second source/drain region includes an upper semiconductor surface. The memory array also includes a number of word lines that interconnect gates of selected access transistors so as to form a number of rows of memory cells. Further, the array includes a number of first isolation trenches separating adjacent rows of memory cells. Each isolation trench houses a word line. Finally, the memory array includes a number of second isolation trenches that are each substantially orthogonal to the first isolation trenches and interposed between adjacent memory cells so as to form a number of rows of the array.

In another embodiment, a method of fabricating a memory array is provided. The method begins by forming a number of access transistors. Each access transistor is formed in a pillar of semiconductor material that extends outwardly from a substrate. The access transistor includes a first source/drain region, a body region and a second source/drain region formed vertically thereupon. The method also provides for forming a trench capacitor for each access transistor. The first plate of the trench capacitor is integral with the first source/drain region of the access transistor. A number of word lines are formed that interconnect the gates of a number of access transistors to form a row of the array. The word lines are disposed from the number of trenches that separate adjacent rows of the access transistors. Finally, the method provides for forming a number of bit lines that interconnect second source/drain regions of selected access transistors so as to form a number of columns of the array. In another embodiment, the method provides for forming a trench capacitor by forming a second plate that surrounds the first plate. In another embodiment, the method includes the step of forming a contact that couples a second plate of the trench capacitor to an underlying semiconductor layer. In another embodiment, the method provides forming a second plate that forms a grid pattern in a layer of semiconductor material such that the grid surrounds each of the pillars that forms the access transistors. In another embodiment, the method further provides depositing poly-silicon in crossing row and isolation trenches formed around the pillars that define the access transistors.

In another embodiment, a method of fabricating a memory array is provided. Initially, a first conductivity type first source/drain region layer is formed on a substrate. Additionally, a second conductivity type body region layer is formed on the first source/drain layer. A first conductivity type second source/drain region layer is formed on the body region layer. A number of substantially parallel column isolation trenches are formed so as to extend through the second source/drain region layer, the body region layer, and the first source/drain region layer so as to form column bars between the column isolation trenches. Additionally, a number of substantially parallel row isolation trenches are formed orthogonal to the column isolation trenches and extending to substantially the same depth as the column isolation trenches. These row isolation trenches form an array of vertical access transistors for the memory array. The row and column isolation trenches are filled with conductive material to a level that does not exceed the lower level of the body region so as to provide a common plate for the capacitors of memory cells of the memory array. Conductive word lines are formed in the row isolation trenches that selectively interconnect access transistors on each row. Finally, bit lines are formed that selectively interconnect the second source/drain regions of the access transistors in each column.

DETAILED DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and logical, mechanical and electrical changes may be made without departing from the scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
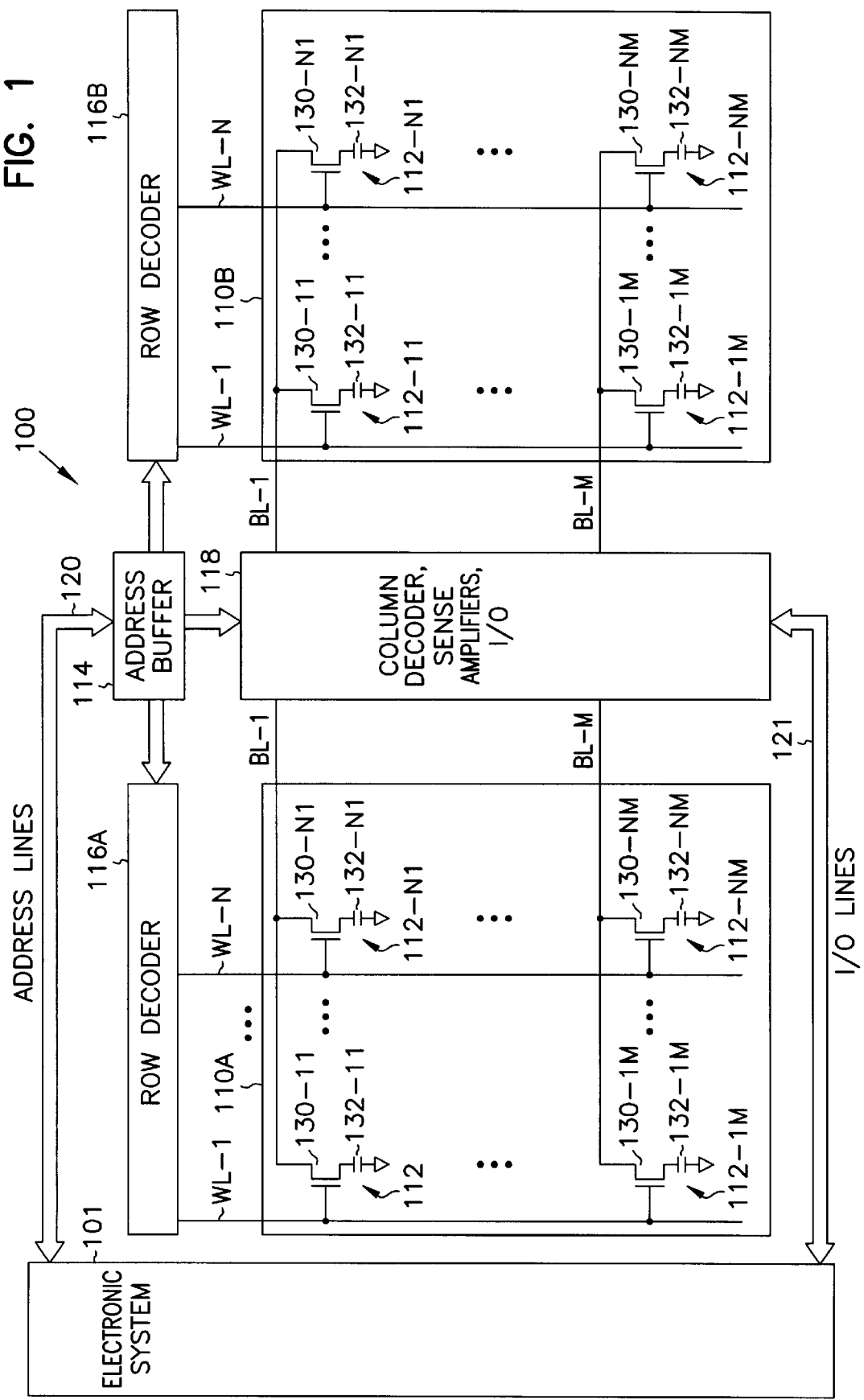
FIG. 1 is a block/schematic diagram of an illustrative embodiment of the present invention that includes a memory device that is coupled to an electronic system.

FIG. 1 is a block/schematic diagram that illustrates generally one embodiment of a memory device 100 incorporating an array of memory cells constructed according to the teachings of the present invention. Memory device 100 is coupled to electronic system 101. Electronic system 101 may comprise, for example, a microprocessor, a memory controller, a chip set or other appropriate electronic system. Memory device 100 illustrates, by way of example but not by way of limitation, a dynamic random access memory (DRAM), in an open bit line configuration. Memory device 100 includes memory arrays 110A and 110B. Each array includes N rows and M columns of memory cells 112-ij, where i refers to the row of the cell and j refers to the column of the cell.

In the exemplary embodiment of FIG. 1, each of memory cells 112-ij has a substantially identical structure, and accordingly, only one memory cell is described herein. These memory cells 112-ij include a vertical transistor where one plate of a capacitor is integral with the transistor. Memory cell 112-11 includes vertical transistor 130-11. A source/drain region of transistor 130-11 is formed in a deep trench and extends to a sufficient depth to form a storage node of storage capacitor 132-11. The other terminal of storage capacitor 132-11 is part of a mesh or grid of poly-silicon that surrounds the source/drain region of transistor 130-11 and is coupled to ground potential.

Each of the N rows of memory cells includes one of word lines WL-1 through WL-N that is formed in a trench separating adjacent rows of memory cells 112-ij. Portions of word lines WL-1 through WL-N adjacent to transistors 130-ij act as gate regions for the respective transistors. Each of the M columns includes one of bit lines BL-1 through BL-M.

Bit lines BL-1 through BL-M are used to write to and read data from memory cells 112-ij. Word lines WL-1 through WL-N are used to access a particular row of memory cells 112-ij that is to be written or read. Addressing circuitry is also included. For example, address buffer 114 is coupled to control column decoder 118, which also includes sense amplifiers and input/output circuitry that is coupled to bit lines BL-1 through BL-M of arrays 110A and 110B. Address buffer 114 also is coupled to control row decoders 116A and 116B. Row decoders 116A and B and column decoder 118 selectably access memory cells 112-ij in response to address signals that are provided on address lines 120 from electronic system 101 during write and read operations.

In operation, memory 100 receives an address of a particular memory cell at address buffer 114. For example, electronic system 101 may provide address buffer 114 with the address for cell 112-11 of array 110A. Address buffer 114 identifies word line WL-1 for memory cell 112-11 to row decoder 116A. Row decoder 116A selectively activates word line WL-1 to activate access transistor 130-1j of each memory cell 112-1j that is connected to word line WL-1. Column decoder 118 selects bit lines BL-1 for memory cell 112-11. For a write operation, data received by input/output circuitry is coupled to bit lines BL-1 and through the access transistor 130-11 to charge or discharge storage capacitor 132-11 of memory cell 112-11 to represent binary data. For a read operation, bit line BL-1 of array 110A is equilibrated with bit line BL-1 of array 110B. Data stored in memory cell 112-11,. as represented by the charge on its storage capacitor 132-11, is coupled to bit line BL-1 of array 110A. The difference in charge in bit lines BL-1 of array 110A and bit line BL-1 of array 110B is amplified, and a corresponding voltage level is provided to the input/output circuits.

Figure 2:
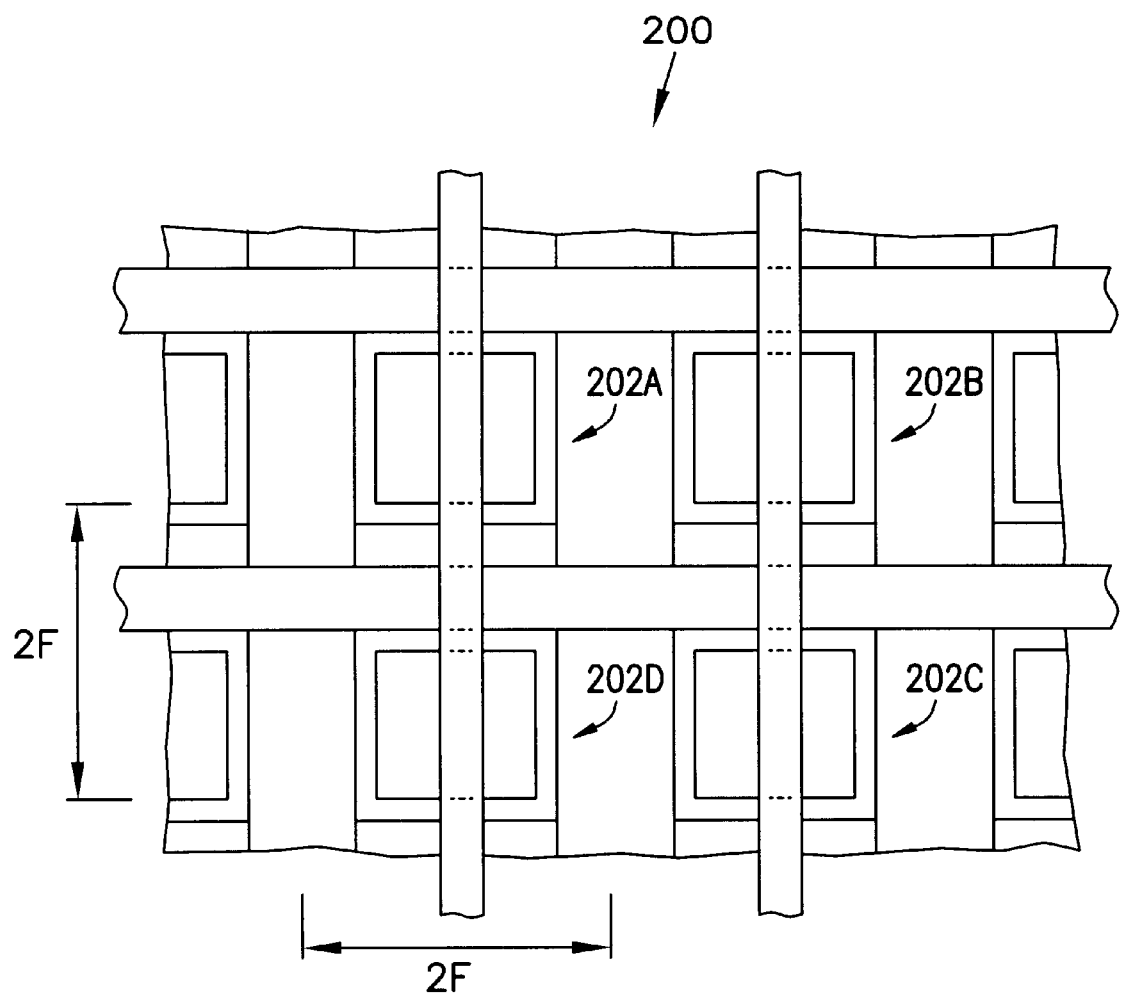
FIG. 2 is a plan view of an illustrative embodiment of a layout for a memory array according to the teachings of the present invention.
Figure 3:
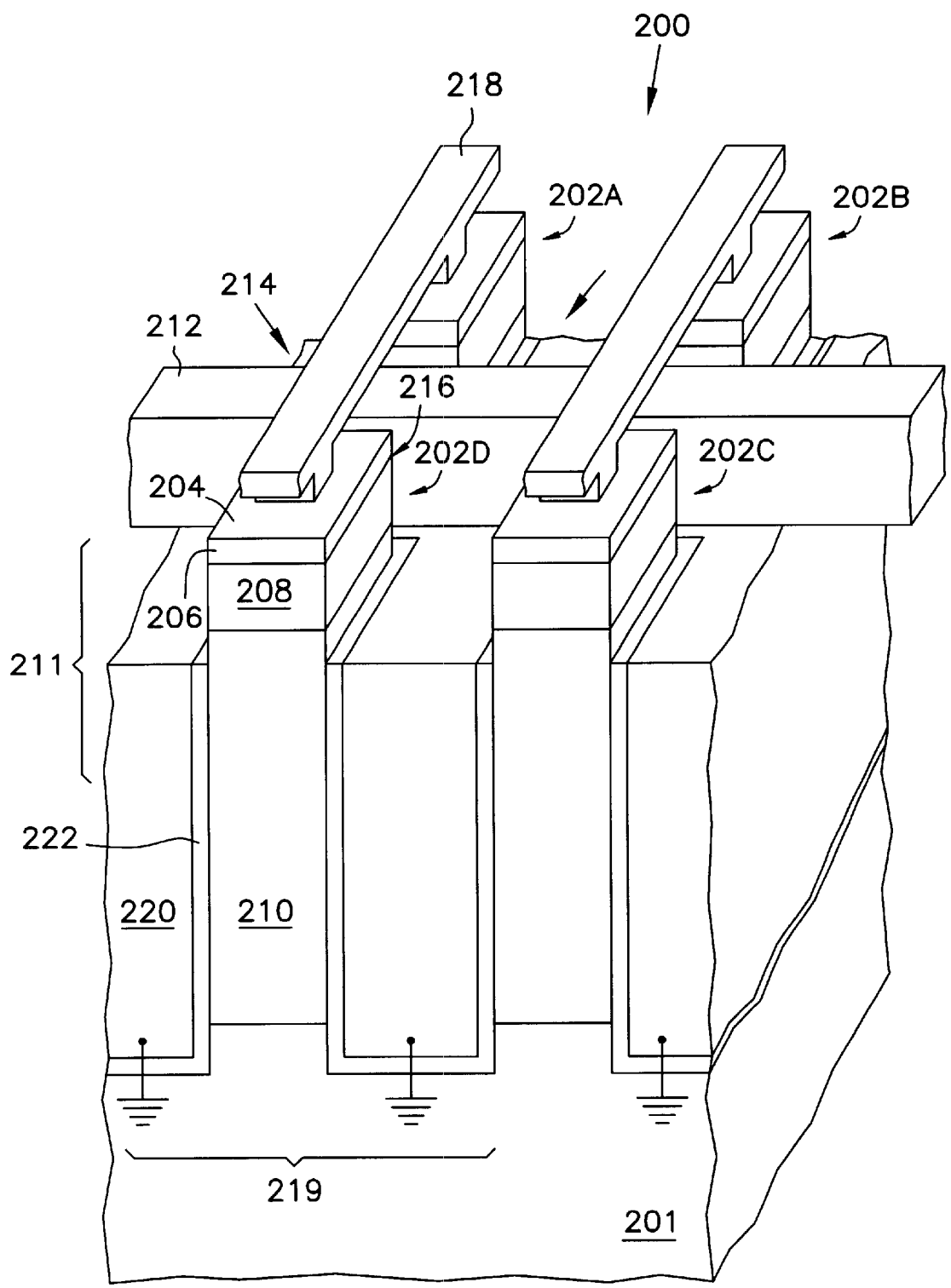
FIG. 3 is a perspective view of the illustrative embodiment of FIG. 2.
Figure 4:
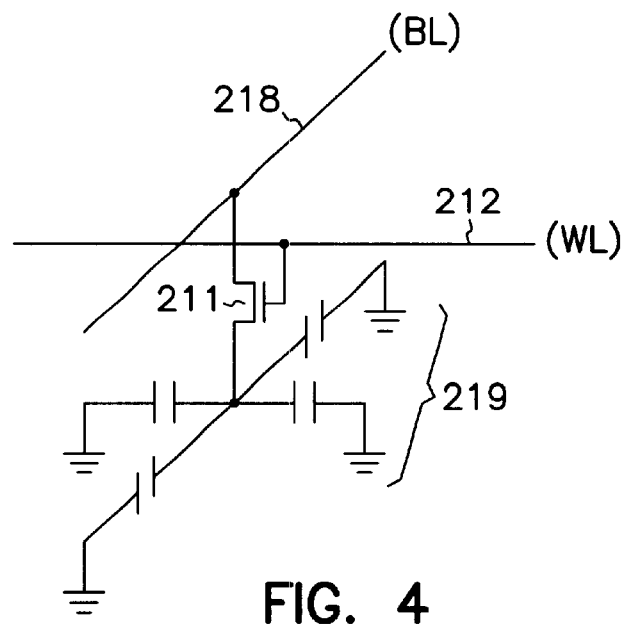
FIG. 4 is a schematic diagram of a memory cell of the embodiment of FIGS. 2 and 3.

FIGS. 2 through 4 illustrate an embodiment of a memory cell with a vertical transistor and trench capacitor for use, for example, in memory device 100 of FIG. 1. Specifically, FIG. 2 is a plan view of a layout of a number of memory cells indicated generally at 202A through 202D in array 200. FIG. 2 depicts only four memory cells. It is understood, however, that array 200 may include a larger number of memory cells even though only four are depicted here.

Each memory cell is constructed in a similar manner. Thus, only memory cell 202D in FIG. 3 is described herein in detail. Memory cell 202D includes pillar 204 of single crystal semiconductor material, e.g., silicon that is divided into first source/drain region 206, body region 208, and second source/drain region 210 to form access transistor 211. Pillar 204 extends vertically outward from substrate 201, for example, p-silicon. First source/drain region 206 and second source/drain region 210 each comprise, for example, n+silicon and body region 208 comprises p-silicon.

Word line 212 passes body region 208 of access transistor 211 in isolation trench 214. Word line 212 is separated from body region 208 of access transistor 204 by gate oxide 216 such that the portion of word line 212 adjacent to body region 208 operates as a gate for access transistor 211. Word line 212 may comprise, for example, n+poly-silicon material that is deposited in isolation trench 214 using a technique such that word line 212 is less than a minimum feature size, F, for the lithographic technique used to fabricate array 200. Cell 202D is coupled in a column with cell 202A by bit line 218.

Memory cell 202D also includes storage capacitor 219 for storing data in the cell. A first plate of capacitor 219 for memory cell 202D is integral with second source/drain region 210 of access transistor 211. Thus, memory cell 202D may be more easily realizable when compared to conventional vertical transistors since there is no need for a contact between second source/drain region 210 and capacitor 219.

Second plate 220 of capacitor 219 is common to all of the capacitors of array 200. Second plate 220 comprises a mesh or grid of n+poly-silicon formed in deep trenches that surrounds at least a portion of second source/drain region 210 of each pillar 204A through 204D. Second plate 220 is grounded by contact with substrate 212 underneath the trenches. Second plate 220 is separated from source/drain region 210 by gate oxide 222.

With this construction for memory cell 202D, access transistor 211 is like a silicon on insulator device. Three sides of the transistor are insulated by thick oxide in the shallow trench. If the doping in pillar 204 is low and the width of the post is sub-micron, then body region 208 can act as a "fully-depleted" silicon on insulator transistor with no body or substrate to contact. This is desirable to avoid floating body effects in silicon on insulated transistors and is achievable due to the use of sub-micron dimensions in access transistor 211.

FIG. 4 is a schematic diagram that illustrates an effective circuit diagram for the embodiment of FIGS. 2 and 3. It is noted that storage capacitor 219 formed by second source/drain region 210 and second plate 220 is depicted as four separate capacitors. This represents that the second plate 220 surrounds second source/drain region 210 which increases the charge storage capacitance and stored charge for the memory cell. It is also noted that second plate 220 is maintained at a constant potential, e.g., ground potential.

As shown in FIG. 2, the memory cells of array 200 are four-square feature ($4F^2$) memory cells. Using cell 202D as an example, the surface area of cell 202D is calculated based on linear dimensions in the bit line and word line directions. In the bit line direction, the distance from one edge of cell 202D to a common edge of adjacent cell 202A is approximately 2 minimum feature sizes (2F). In the word line direction, the dimension is taken from the midpoint of isolation trenches on either side of memory cell 202D. Again, this is approximately two minimum feature sizes (2F). Thus, the size of the cell is $4F^2$. This size is much smaller than the current cells with stacked capacitors or trenched capacitors.

FIGS. 5A through 5J illustrate one embodiment of a process for fabricating an array of memory cells, indicated generally at 299, according to the teachings of the present invention. In this example, dimensions are given that are appropriate to a 0.2 micrometer lithographic image size. For other image sizes, the vertical dimensions can be scaled accordingly.

Figure 5A:
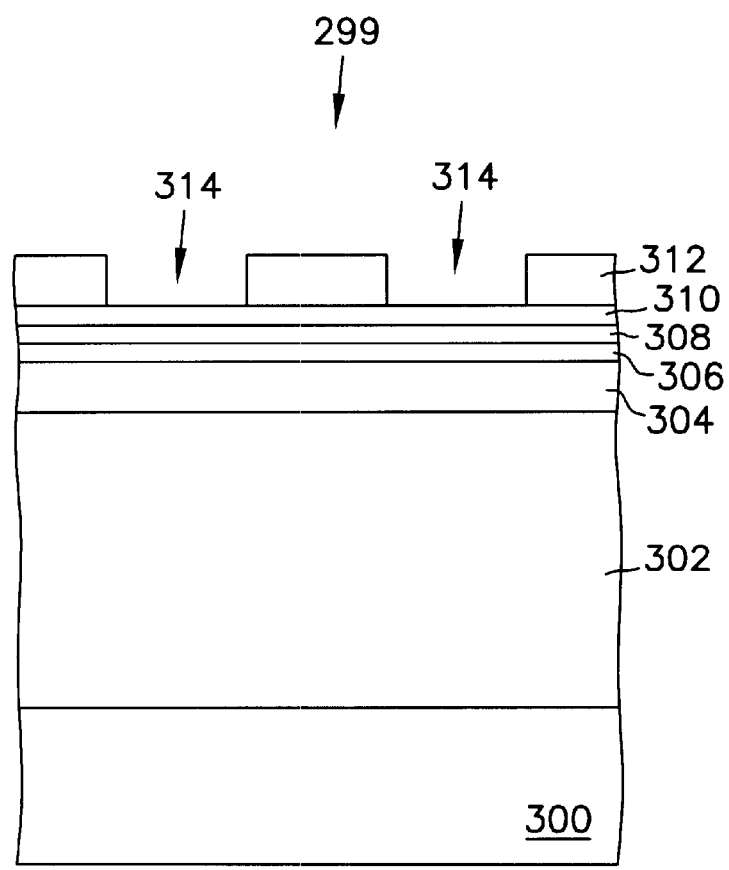
FIGS. 5A through 5J are perspective and elevational views of an embodiment of an integrated circuit that illustrate processing steps for fabricating the integrated circuit according to the teachings of the present invention.

As shown in FIG. 5A, the method begins with substrate 300. Substrate 300 comprises, for example, a P-type silicon wafer, layer of P-silicon material, or other appropriate substrate material. Layer 302 is formed, for example, by epitaxial growth outwardly from layer 300. Layer 302 comprises single crystalline N+silicon that is approximately 3.5 micrometers thick. Layer 304 is formed outwardly from layer 302 by epitaxial growth of single crystalline P-silicon of approximately 0.5 microns. Layer 306 is formed by ion implantation of donor dopant into layer 304 such that layer 306 comprises single crystalline N+silicon with a depth of approximately 0.1 microns.

A thin layer of silicon dioxide ($SiO_2$), referred to as pad oxide 308, is deposited or grown on layer 306. Pad oxide 308 has a thickness of approximately 10 nanometers. A layer of silicon nitride ($Si_3N_4$), referred to as pad nitride 310, is deposited on pad oxide 308. Pad nitride 310 has a thickness of approximately 200 nanometers.

Figure 5B:
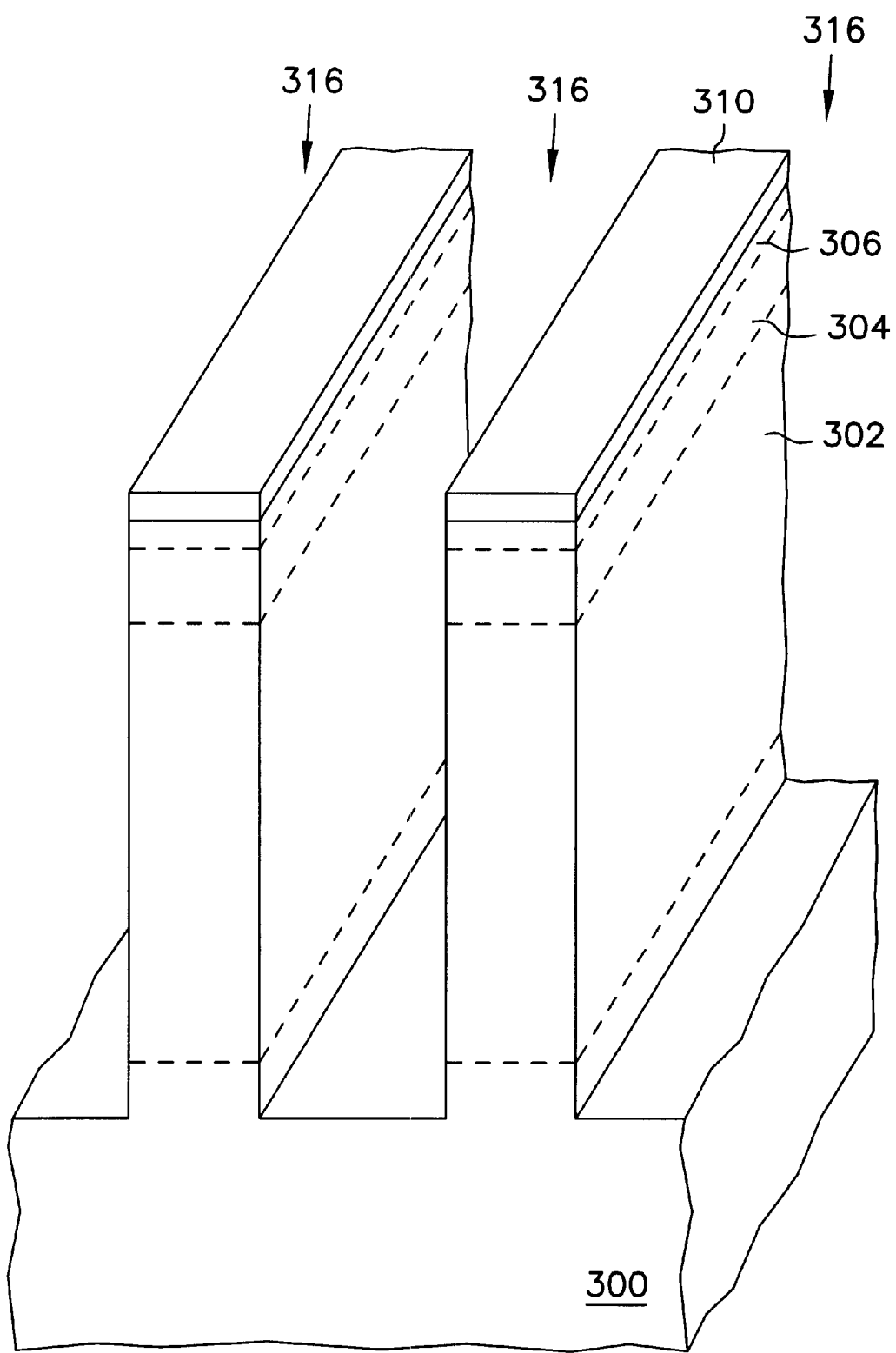
Figure 5C:
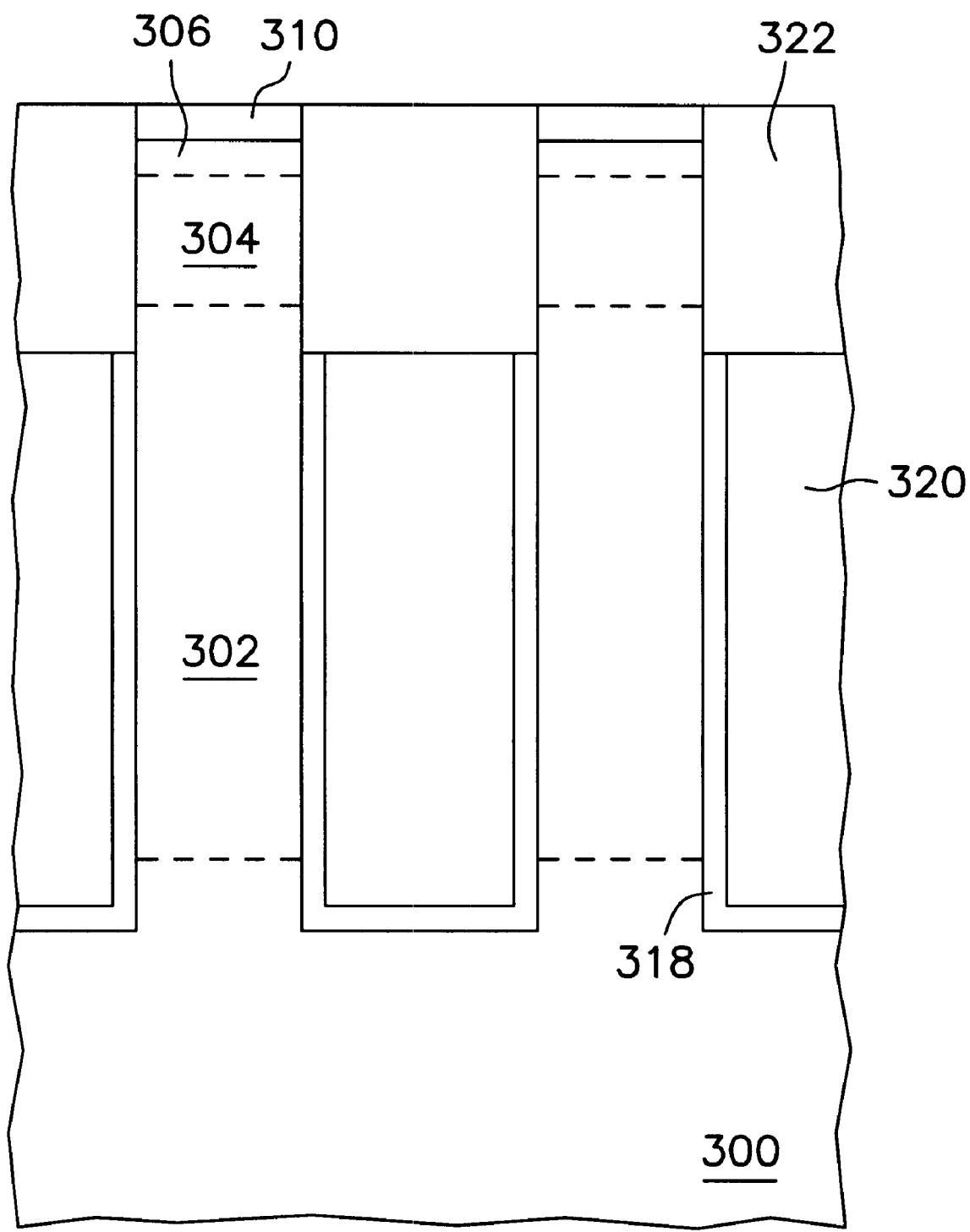

Photo resist layer 312 is deposited outwardly from layer 310. Photo resist layer 312 is patterned with a mask to define openings 314 in layer 312 to be used in selective etching. As shown in FIG. 5B, column isolation trenches 316 are etched through openings 314 in photo resist layer 312 in a direction parallel to which the bit lines will be formed. Column isolation trenches 316 extend down through nitride layer 310, oxide layer 308, N+layer 306, P-layer 304, N+layer 302, and into substrate 300.

A thin thermal protective oxide layer 318 is grown on exposed surfaces of substrate 300 and layers 302, 304, and 306. Layer 318 is used to protect substrate 300 and layers 302, 304 and 306 during subsequent process step.

A layer of intrinsic poly-silicon 320 is deposited by chemical vapor deposition (CVD) to fill column isolation trenches 316. Layer 320 is etched by reactive ion etching (RIE) such that layer 320 is recessed below a top of layer 302. Layer 322 of silicon nitride ($Si_3N_4$) is deposited by, for example, chemical vapor deposition to fill trenches 316. Layer 322 is planarized back to a level of layer 310 using, for example, chemical mechanical polishing (CMP) or other suitable planarization technique to produce the structure shown in FIG. 5C.

Figure 5D:
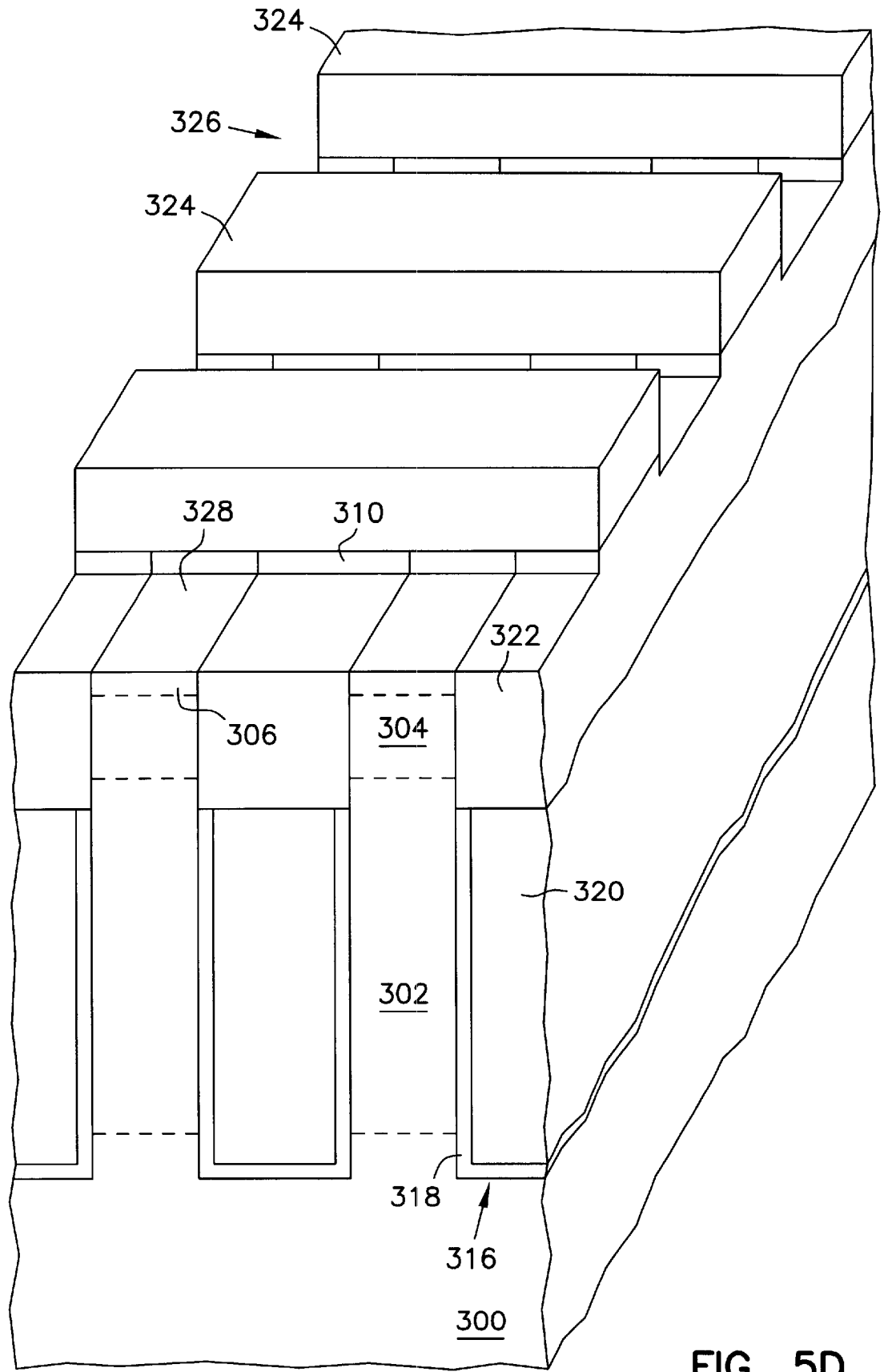

As shown in FIG. 5D, layer 324 of photo resist material is deposited outwardly from nitride layers 322 and 310. Layer 324 is exposed through a mask to define openings 326 in layer 324. Openings 326 are orthogonal to trenches 316 that were filled by intrinsic poly-silicon layer 320 and nitride layer 322. Next, nitride layers 310 and 322 are etched to a depth sufficient to expose a working surface 328 of layer 306. It is noted that at this point layer 320 of intrinsic poly-silicon is still covered by a portion of nitride layer 322.

Figure 5E:
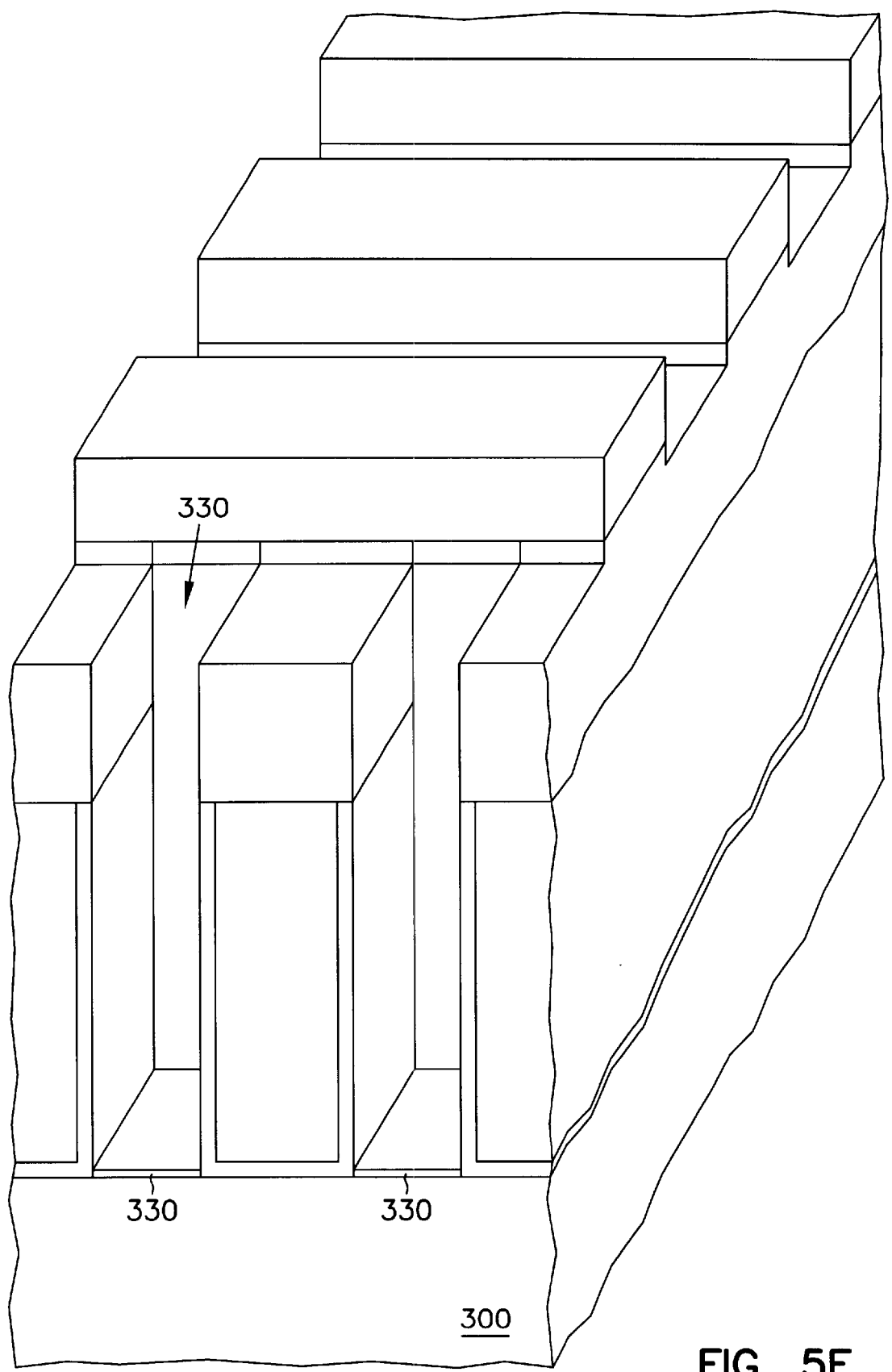

As shown in FIG. 5E, the portion of layers 306, 304, and 302 that are exposed in openings 326 are selectively etched down to a distance approximately equal to column isolation trenches 316. A thin thermal protective oxide is grown on the exposed silicon of layers 302, 304 and 306 as well as an exposed upper surface of layer 300. This oxide layer is labeled 330 in FIG. 5E.

Figure 5F:
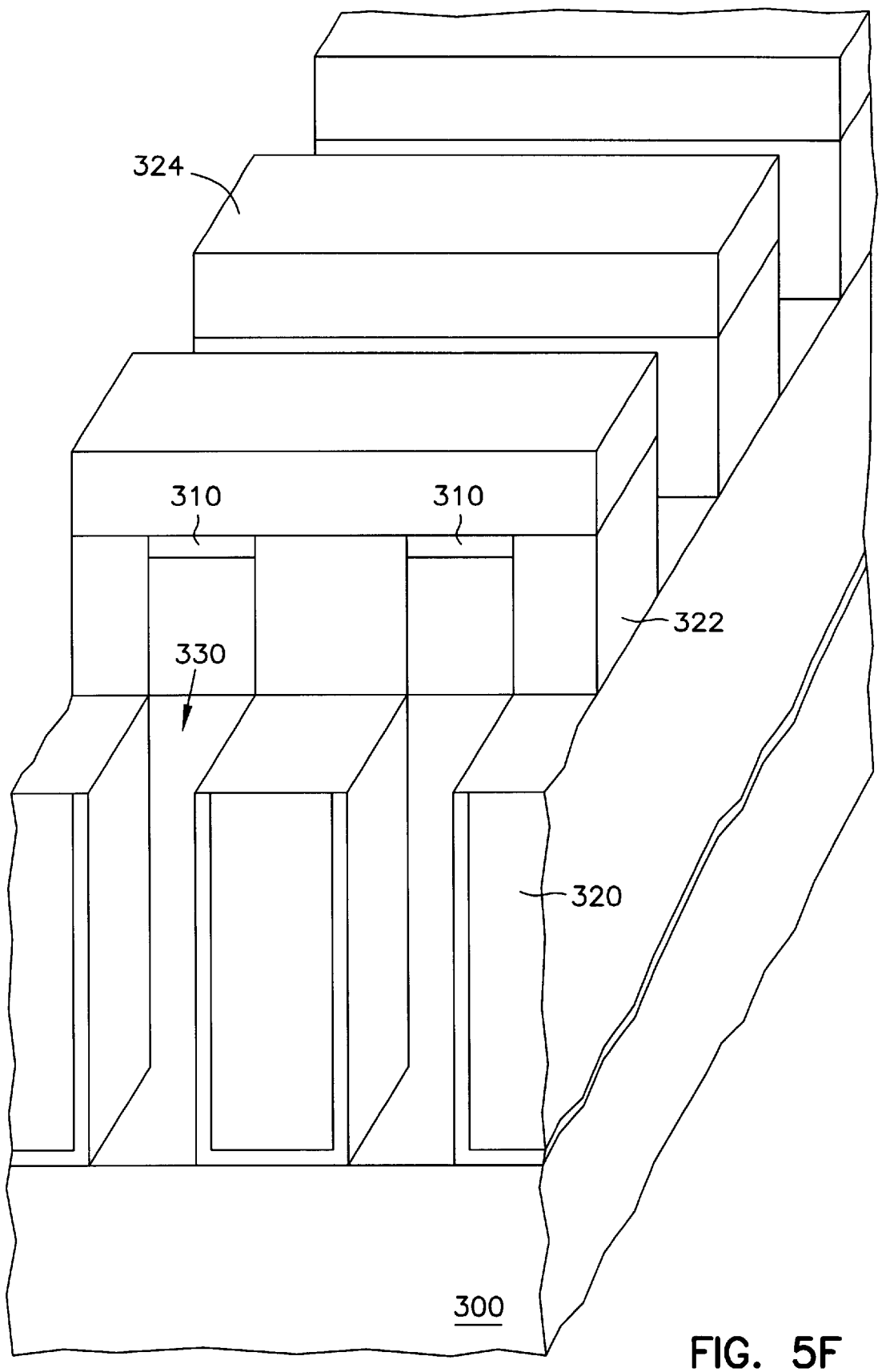
Figure 5G:
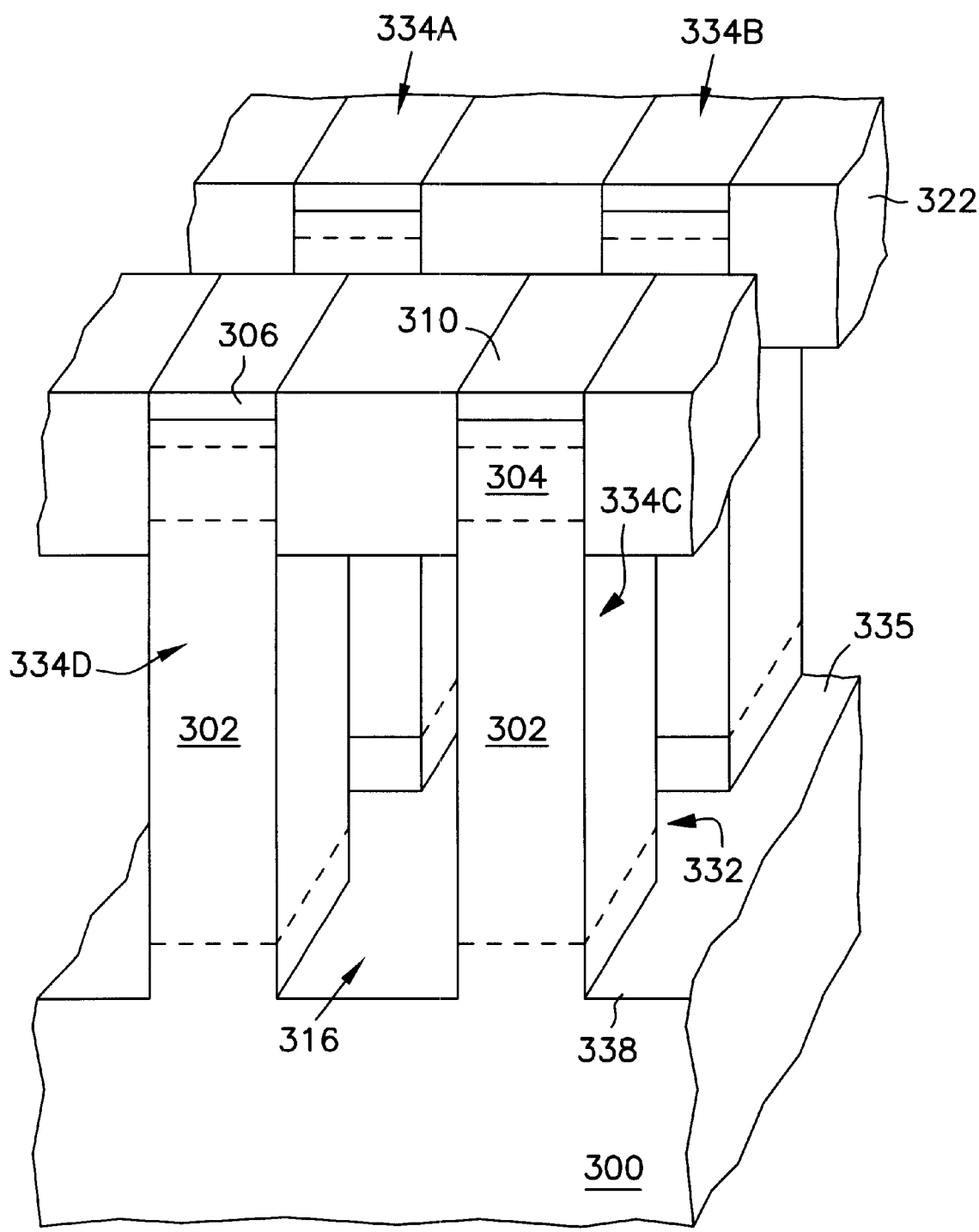

As shown in FIG. 5F, the remaining nitride layer 322 exposed in openings 326 is directionally etched to expose layer of intrinsic poly-silicon 320. It is noted that nitride layer 322 and nitride layer 310 remain intact under the photo resist layer 324. Layer of intrinsic poly-silicon 320 is next isotropically etched using a silicon etchant which does not attack oxide or nitride layers. Next, an isotropic oxide etch is performed to remove all exposed thin oxide. The photo resist layer 324 is removed. At this point, the method has produced the structure shown in FIG. 5G. This structure includes a nitride bridge formed from nitride layers 310 and 322 that extends orthogonal to column isolation trenches 316 and covers the remaining portions of layers 302, 304, and 306. The structure also includes row isolation trenches 332 that are orthogonal to column isolation trenches 316. The structure of FIG. 5G also includes pillars 334A through 334D of single crystal silicon material Pillars 334A through 334D form the basis for individual memory cells for the memory array formed by the process.

An optional metal contact 336 may be formed by, for example, deposition of a collimated refractory metal deposition, e.g., titanium, tungsten, or a similar refractory metal. This provides an ohmic metal contact for a capacitor plate on a surface 335 of substrate 300.

Dielectric layer 338 is deposited or grown on sidewalls of layer 302 of pillars 334A through 334D. Layer 338 acts as the dielectric for the storage capacitors of array 299 of memory cells. If contact 336 was previously deposited on a surface of substrate 300, dielectric layer 338 should be directionally etched to clear dielectric material from the bottom of row isolation trench 332.

Figure 5H:
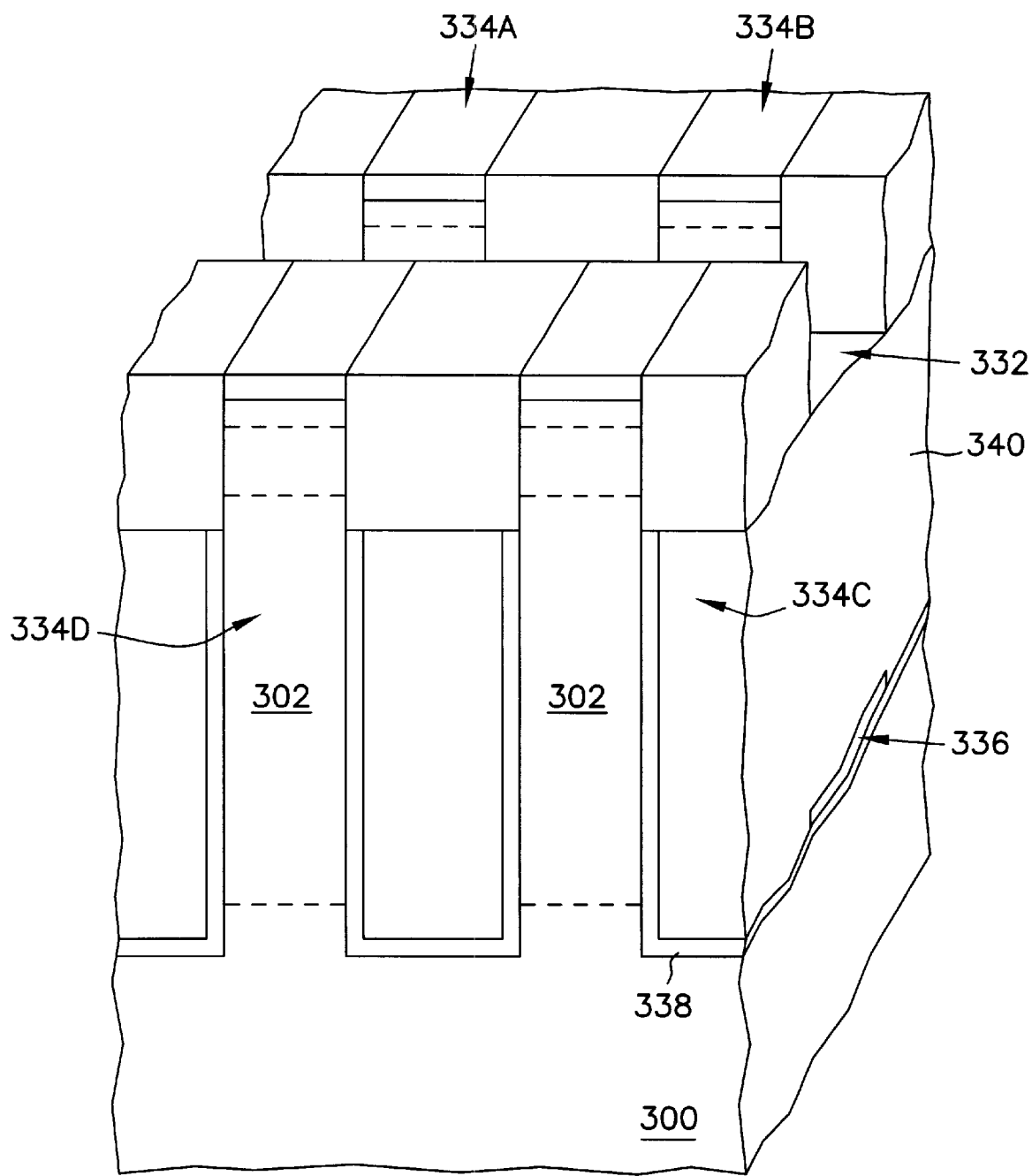

Next, a common plate for all of the memory cells of array 299 is formed by a chemical vapor deposition of N+poly-silicon or other appropriate refractory conductor in column isolation trenches 316 and row isolation trenches 322. In this manner, conductor mesh or grid 340 is formed so as to surround each of pillars 334A through 334D. Mesh 340 is planarized and etched back to a level approximately at the bottom of the nitride bridge formed by nitride layers 322 and 310 as shown in FIG. 5H. An additional etch is performed to remove any remaining exposed capacitor dielectric of layer 338 from the sides of semiconductor pillars 334A through 334D.

Figure 5I:
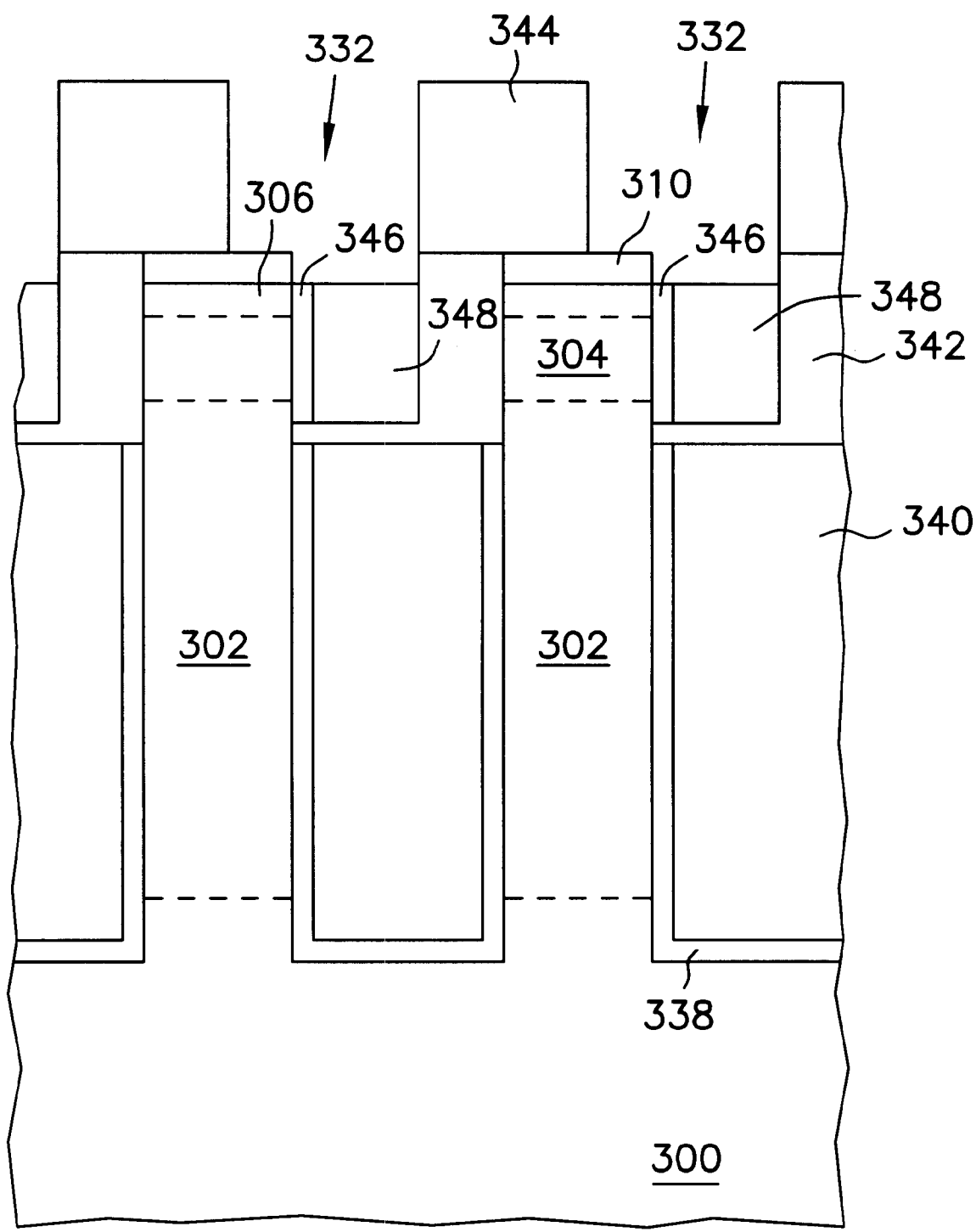
Figure 5J:
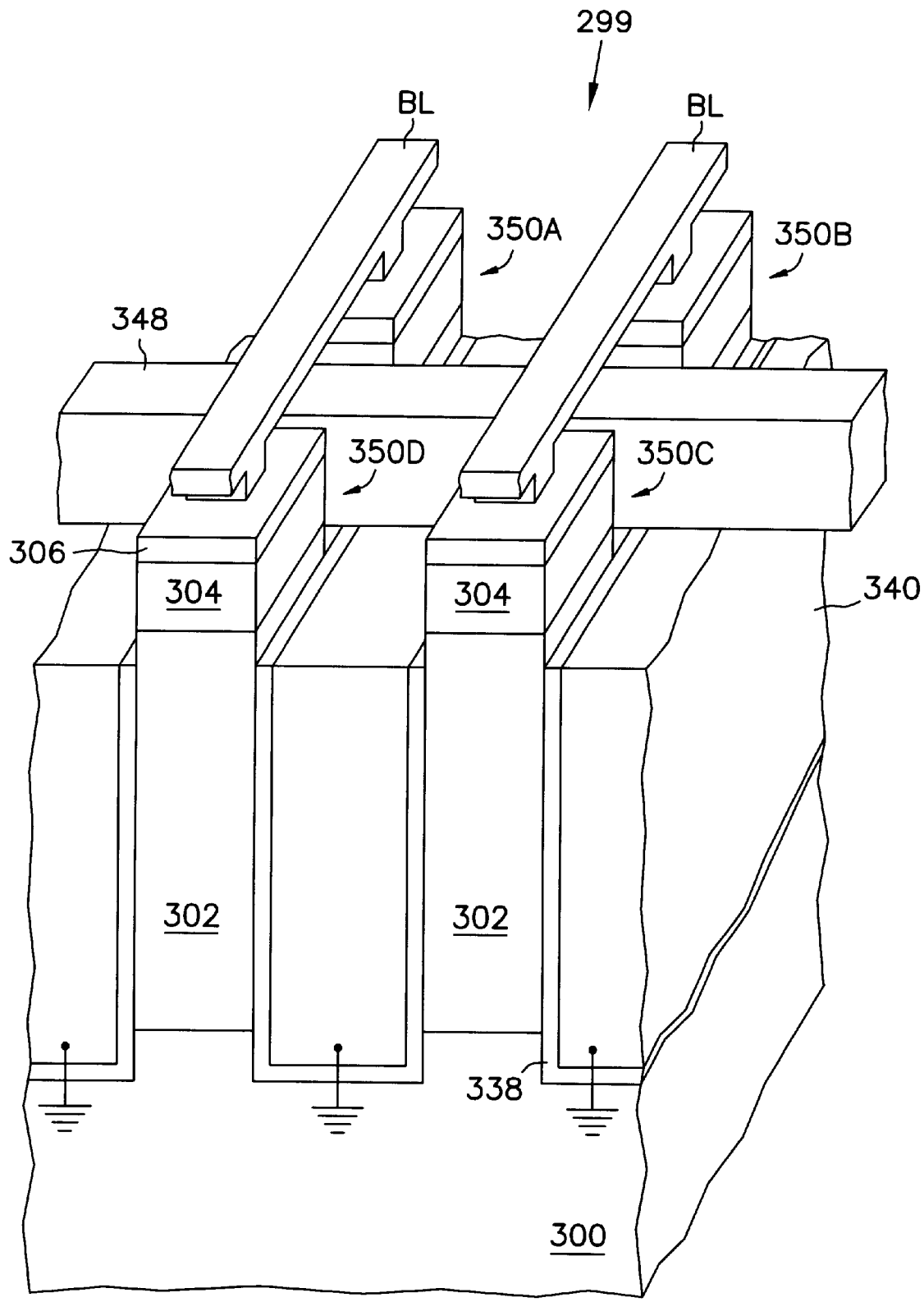

Referring to FIG. 5I, row isolation trenches 332 are filled with an oxide material by chemical vapor deposition that fills row isolation trenches 332 with oxide layer 342. Oxide layer 342 is planarized using, for example, a chemical mechanical polishing technique or other appropriate planarization technique to bring oxide layer 342 coplanar with the top surface of nitride layer 310.

Photo resist layer 344 is deposited and patterned using a mask to define stripes in the direction of row isolation trenches 332 so as to define the location of word lines for array 299. Oxide layer 342 is selectively etched to a depth approximately at the top of layer 302. Gate oxide layer 346 is grown or deposited on sidewalls of pillars 334A through 334D to form a gate oxide for the transistors for each memory cell. A material such as N+poly-silicon is deposited by, for example, chemical vapor deposition (CVD) into the remaining portion of row isolation trench 332 in order to form word lines 348. Word lines 348 are planarized and recessed to a depth at least to the top of silicon pillars 334A through 334D. It is noted that by so forming word line 348, word line 348 is "sub-lithographic" in that the width of word line 348 in the bit line direction is less than F, the minimum feature size for the lithographic process used to form array 299. Photo resist layer 344 is removed. An oxide cap layer is deposited by chemical vapor deposition and conventional techniques are used to add bit lines (BL) that contact layers 306 of semiconductor pillars 334A through 334D in order to produce array 299 shown in FIG. 5J. Array 299 includes memory cells 350A through 350D formed by pillars 334A through 334D, respectively, and surrounding mesh 340.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the semiconductor materials specified in this application are given by way of example and not by way of limitation. Other appropriate material can be substituted without departing from the spirit and scope of the invention.

What is claimed is:

1. A method of forming a memory cell comprising:
    forming an access transistor, comprising:
      forming a pillar of semiconductor material that extends outwardly from a substrate;
      forming a first source/drain region from a portion of the pillar of semiconductor material;
      forming a body region from a portion of the pillar of semiconductor material, the body region being coupled to the first source/drain region;
      forming a second source/drain region from a portion of the pillar of semiconductor material, the second source/drain region being coupled to the body region;
    forming a trench capacitor, wherein a first plate of the trench capacitor is formed from a portion of the pillar of semiconducting material adjacent to the second source/drain region.

2. The method of claim 1, wherein forming a trench capacitor further includes forming a second plate that surrounds the first plate.

3. The method of claim 2, wherein forming a second plate that surrounds the first plate includes depositing poly-silicon around the first plate.

4. A method of forming a memory cell comprising:
    forming a lower first conductivity type layer on a substrate;
    forming a second conductivity type body region layer on the lower first conductivity type layer;
    forming an upper first conductivity type layer on the body region layer;
    removing a surrounding portion of the lower first conductivity type layer, the body region layer, and the upper first conductivity type layer to form a vertical pillar extending outward from the substrate wherein the upper first conductivity type layer forms a first source/drain region, and a portion of the lower first conductivity type layer forms a second source/drain region;
    coupling a dielectric layer to a portion of the lower first conductivity type layer of the vertical pillar, the dielectric layer surrounding a first plate of a capacitor; and
    depositing a conductive material around the dielectric layer to provide a second plate for the capacitor.

5. The method of claim 4, wherein depositing a conductive material includes depositing polysilicon.

6. The method of claim 4, wherein removing a surrounding portion of the lower first conductivity type layer, the body region layer, and the upper first conductivity type layer to form a vertical pillar includes forming a vertical pillar with a sub-micron width.

7. A method of forming a memory cell comprising:
    forming a lower first conductivity type layer on a substrate;
    forming a second conductivity type body region layer on a second conductivity type body region layer;
    forming a an upper first conductivity type layer on the body region layer;
    removing a surrounding portion of the lower first conductivity type layer, the body region layer, and the upper first conductivity type layer to form a vertical pillar extending outward from the substrate wherein the upper first conductivity type layer forms a first source/drain region, and
    a portion of the lower first conductivity type layer forms a second source/drain region;
    coupling a dielectric layer to a portion of the lower first conductivity type layer of the vertical pillar, the dielectric layer surrounding a first plate of a capacitor;
    depositing a conductive material around the dielectric layer to provide a second plate for the capacitor; and
    forming a contact between the second plate and an underlying semiconductor layer.

8. The method of claim 7, wherein depositing a conductive material includes depositing polysilicon.

9. The method of claim 7, wherein removing a surrounding portion of the lower first conductivity type layer, the body region layer, and the upper first conductivity type layer to form a vertical pillar includes forming a vertical pillar with a sub-micron width.

10. A method of forming a memory device comprising:
forming a number of access transistors, each comprising:
forming a pillar of semiconductor material that extends outwardly from a substrate;
forming a first source/drain region from a portion of the pillar of semiconductor material;
forming a body region from a portion of the pillar of semiconductor material, the body region being coupled to the first source/drain region;
forming a second source/drain region from a portion of the pillar of semiconductor material, the second source/drain region being coupled to the body region;
forming a number of bit lines that are each selectively coupled to a number of the second source/drain regions of the access transistors;
forming a number of wordlines that are each operatively located adjacent the body regions of the access transistors;
forming a row decoder coupled to the word lines, and a column decoder coupled to the bitlines; and
forming a number of trench capacitors, coupled to the number of access transistors wherein a first plate of the each trench capacitor is formed from a portion of the pillar of semiconducting material adjacent to the second source/drain region.

11. The method of claim 10, wherein forming a number of trench capacitors further includes forming a second plate that surrounds the first plate in each capacitor.

12. The method of claim 11, wherein forming a second plate that surrounds the pillar includes depositing polysilicon around the first plate.

13. A method of forming a memory device comprising:
forming a first conductivity type first source/drain region layer on a substrate;
forming a second conductivity type body region layer on the first source/drain region layer;
forming a first conductivity type second source/drain region layer on the body region layer;
forming a number of substantially parallel column isolation trenches extending through the second source/drain region layer, the body region layer, and the first source/drain region layer, thereby forming column bars between the column isolation trenches;
forming a plurality of substantially parallel row isolation trenches, orthogonal to the column isolation trenches, extending to substantially the same depth as the column isolation trenches, thereby forming an array of vertical access transistors for the memory array;
depositing a dielectric layer within the row and column isolation trenches;
filling the row and column isolation trenches with a conductive material to a level that does not exceed the lower level of the body region so as to provide a common plate for capacitors of memory cells of the memory array;
forming conductive word lines in the row isolation trenches that selectively interconnect access transistors on each row;
forming bit lines that selectively interconnect the second source/drain regions of the access transistors on each column; and
forming a row decoder coupled to the word lines, and a column decoder coupled to the bitlines.

14. The method of claim 13, wherein filling the surrounding portion with a conductive material includes filling the surrounding portion with polysilicon.

15. The method of claim 13, wherein removing a surrounding portion of the first source/drain region layer, the body region layer, and the second source/drain region layer to form a vertical pillar includes forming a vertical pillar with a sub-micron width.

16. The method of claim 13, wherein forming conductive word lines includes concurrently forming a number of gates adjacent to the body region layer.

17. A method of forming a memory device comprising:
forming a first conductivity type first source/drain region layer on a substrate;
forming a second conductivity type body region layer on the first source/drain region layer;
forming a first conductivity type second source/drain region layer on the body region layer;
forming a number of substantially parallel column isolation trenches extending through the second source/drain region layer, the body region layer, and the first source/drain region layer, thereby forming column bars between the column isolation trenches;
forming a plurality of substantially parallel row isolation trenches, orthogonal to the column isolation trenches, extending to substantially the same depth as the column isolation trenches, thereby forming an array of vertical access transistors for the memory array;
depositing a dielectric layer within the row and column isolation trenches to a level that does not exceed the lower level of the body region;
filling the row and column isolation trenches with a conductive material to a level that does not exceed the lower level of the body region so as to provide a common plate for capacitors of memory cells of the memory array;
forming a contact between the common plate and an underlying semiconductor layer;
forming conductive word lines in the row isolation trenches that selectively interconnect access transistors on each row;
forming bit lines that selectively interconnect the second source/drain regions of the access transistors on each column; and
forming a row decoder coupled to the word lines, and a column decoder coupled to the bitlines.

18. The method of claim 17, wherein filling the surrounding portion with a conductive material includes filling the surrounding portion with polysilicon.

19. The method of claim 17, wherein removing a surrounding portion of the first source/drain region layer, the body region layer, and the second source/drain region layer to form a vertical pillar includes forming a vertical pillar with a sub-micron width.

20. The method of claim 17, wherein forming conductive word lines includes concurrently forming a number of gates adjacent to the body region layer.

21. A method of forming a memory device comprising:
forming a first conductivity type first source/drain region layer on a substrate;
forming a second conductivity type body region layer on the first source/drain region layer;
forming a first conductivity type second source/drain region layer on the body region layer;

forming a number of substantially parallel column isolation trenches extending through the second source/drain region layer, the body region layer, and the first source/drain region layer, thereby forming column bars between the column isolation trenches;

forming a plurality of substantially parallel row isolation trenches, orthogonal to the column isolation trenches, extending to substantially the same depth as the column isolation trenches, thereby forming an array of vertical access transistors for the memory array;

depositing a dielectric layer within the row and column isolation trenches;

filling the row and column isolation trenches with a conductive material to a level that does not exceed the lower level of the body region so as to provide a common plate for capacitors of memory cells of the memory array;

forming conductive word lines in the row isolation trenches that selectively interconnect access transistors on each row, wherein the conductive wordlines are formed to a width that is less than a minimum lithographic feature size F used to form the column isolation trenches and the row isolation trenches;

forming bit lines that selectively interconnect the second source/drain regions of the access transistors on each column; and forming a row decoder coupled to the word lines, and a column decoder coupled to the bitlines.

22. The method of claim 21, wherein filling the surrounding portion with a conductive material includes filling the surrounding portion with polysilicon.

23. The method of claim 21, wherein removing a surrounding portion of the first source/drain region layer, the body region layer, and the second source/drain region layer to form a vertical pillar includes forming a vertical pillar with a sub-micron width.

24. The method of claim 21, wherein forming conductive word lines includes concurrently forming a number of gates adjacent to the body region layer.

* * * * *